United States Patent [19]
Oki et al.

[11] Patent Number: 5,840,612
[45] Date of Patent: Nov. 24, 1998

[54] METHOD OF FABRICATING VERY HIGH GAIN HETEROJUNCTION BIPOLAR TRANSISTORS

[75] Inventors: Aaron K. Oki, Torrance; Dwight C. Streit, Seal Beach; Donald K. Umemoto, Manhattan Beach; Liem T. Tran, Torrance, all of Calif.

[73] Assignee: TRW Inc., Redondo Beach, Calif.

[21] Appl. No.: 911,388

[22] Filed: Aug. 14, 1997

Related U.S. Application Data

[63] Continuation of Ser. No. 648,526, May 13, 1996, abandoned.

[51] Int. Cl.$^6$ ............................................. H01L 21/331
[52] U.S. Cl. ........................... 438/312; 438/320; 438/343
[58] Field of Search .................................... 438/309, 312, 438/313, 317, 320, 343, 364; 148/DIG. 100, DIG. 72, DIG. 10; 257/197

[56] References Cited

U.S. PATENT DOCUMENTS

| | | |
|---|---|---|
| 4,731,340 | 3/1988 | Chang et al. . |
| 4,839,303 | 6/1989 | Tully et al. ............................. 438/312 |
| 5,001,534 | 3/1991 | Lunardi et al. . |
| 5,093,280 | 3/1992 | Tully ...................................... 438/312 |
| 5,106,766 | 4/1992 | Lunardi et al. .................. 148/DIG. 72 |
| 5,264,379 | 11/1993 | Shikata .................................... 438/315 |
| 5,298,439 | 3/1994 | Liu et al. . |
| 5,344,786 | 9/1994 | Bayraktaroglu . |
| 5,355,021 | 10/1994 | Crouch et al. . |
| 5,362,658 | 11/1994 | Kuragaki . |
| 5,429,986 | 7/1995 | Okada . |
| 5,587,327 | 12/1996 | Konig et al. ............................ 438/312 |

FOREIGN PATENT DOCUMENTS

| | | |
|---|---|---|
| 0478923 | 8/1991 | European Pat. Off. . |
| 0592765 | 4/1993 | European Pat. Off. . |

OTHER PUBLICATIONS

"Tradeoff Between 1/F Noise and Microwave Performance in ALGaAs/GaAs Hereojunction Bipolar Transistors", by: Damian Costa, Marcel N. Tutt, Ali Khatibzadeh, and Minitris Pavlidis, Fellow, IEEE, IEEEE Transactions on Electron Devices, vol. 41, No. 8, Aug. 1994.

"Negative Differential Resistance of ALGaAs/GaAs Heterojunction Bipolar Transistors: Influence of Emitter Edge Current", by: J. R. Waldrop and M. F. Chang, IEEE Electron Device Letters, vol. 16, No. 1 Jan. 1995.

"High Current Gain, Low Offset Voltage Heterostructure Emitter Bipolar Transistors" by: H. R. Chen, C. Y. Chang, Fellow, IEEE, C. P. Lee, Member, IEEE, C. H. Huang, J. S. Tsang, and K. L. Tsai, IEEE Electron Device Letters vol. 15, No. 9, Sep. 1994.

*Primary Examiner*—Tuan H. Nguyen
*Attorney, Agent, or Firm*—Michael S. Yatsko

[57] ABSTRACT

A heterojunction bipolar transistor with a vertically integrated profile includes a substrate layer, a collector contact layer, a collector layer, a base layer and an emitter layer, formed from AlGaAs, etched to form an emitter mesa leaving a relatively thin passivating layer, adjacent the emitter mesa. The base metal contacts are formed on the passivating layer, resulting in a wider bandgap, thus minimizing surface recombination velocity at the emitter-base junction and increasing the overall gain ($\beta$) of the device. The base metal contacts are formed by evaporating a p-ohmic metal onto the n-type passivation layer. The p-ohmic contacts are annealed, resulting in p-type metal diffusion through the passivating layer and reaction with the base layer, resulting in ohmic contacts.

14 Claims, 5 Drawing Sheets

ABSTRACT/CONTENT:

METHOD OF FABRICATING VERY HIGH GAIN HETEROJUNCTION BIPOLAR TRANSISTORS

This is a continuation, of application Ser. No. 08/648,526, filed May 13, 1996 now abandoned.

BACKGROUND OF THE INVENTION

1. Field of the Invention

The present invention relates to a heterojunction bipolar transistor (HBT) and a method for fabricating an HBT, and more particularly to a process for fabricating HBTs, which includes a thin passivating layer to provide passivation at the emitter-base junction to provide a relatively wider bandgap, as well as minimizing recombination velocity at the emitter-base junction, which includes base metal contacts formed from evaporation of an ohmic metal onto the passivation layer, which, when annealed, forms the base ohmic contacts.

2. Description of the Prior Art

Processes for fabricating heterojunction bipolar transistors (HBTs) are known in the art. Examples of such processes are disclosed in U.S. Pat. Nos. 5,298,439 and 5,344,786, hereby incorporated by reference.

The '439 patent discloses a method of fabricating a heterojunction bipolar transistor, which includes a substrate, a collector layer, a base layer, an emitter layer and an emitter contact layer. An emitter metal is deposited over a portion over the emitter contact layer and used as a mask during the etching of the emitter mesa, which removes the emitter contact layer not covered by the emitter metal. In addition, the etching is controlled to etch away all but a thin portion of the emitter layer forming a ledge adjacent the emitter mesa. A photoresist is then used to define the base metal contacts. The relatively thin emitter layer is then etched in a standard manner to the base layer. The exposed portion of the base layer is then used to form the base metal contacts. Since the ledge portion of the emitter layer increases the actual effective emitter area of the HBT device, such a configuration has been known to affect device reliability.

The '786 patent discloses an HBT that includes a substrate layer, a collector layer, a base layer, an emitter layer, an ohmic emitter contact layer, as well as a dielectric layer. A photoresist is patterned to remove all but a portion of the dielectric layer. The remaining dielectric layer acts as a mask to enable etching of the device down to the base layer to enable formation of the base ohmic contacts.

The problem with etching down the base layer or beyond base are explained with reference to FIGS. 1 and 2. FIGS. 1 and 2 illustrate a semiconductor having a substrate layer 20, a collector contact layer 22, a collector layer 24 and a base layer 26. An emitter layer is epitaxially grown on top of the base layer and etched down to the base layer to form an emitter mesa 28 and to enable a pair of base metal contacts 30 and 32 to be directly formed on the base layer. In FIG. 1, the emitter mesa 28 is etched to the emitter-base junction. FIG. 2 illustrates etching of the emitter mesa beyond the emitter-base junction illustrating a portion of the base layer 26 being etched off. Because of the relatively lower bandgap of the emitter-base junction in configurations, the surface recombination velocity is increased at the emitter-base junction, thereby lowering the gain ($\beta$).

SUMMARY OF THE INVENTION

It is an object of the present invention to solve various problems in the prior art.

It is yet another object of the present invention to provide a heterojunction bipolar transistor with a relatively wider bandgap at the emitter-base junction.

It is yet another object of the present invention to provide a heterojunction bipolar transistor with minimized surface recombination velocity at the emitter-base junction.

It is yet another object of the present invention to provide a heterojunction bipolar transistor with increased gain ($\beta$) relative to known devices.

Briefly, the present invention relates to a heterojunction bipolar transistor (HBT) which includes a substrate layer, a collector contact layer, a collector layer, a base layer, an emitter layer, formed from AlGaAs, etched to form an emitter mesa and a relatively thin passivating layer adjacent the emitter mesa. The base metal contacts are formed on the passivating layer, resulting in a wider bandgap, thus minimizing surface recombination velocity at the emitter-base junction and increasing the overall gain ($\beta$) of the device. The base metal contacts are formed by evaporating a p-ohmic metal onto the n-type passivation layer. The p-ohmic contact is annealed, resulting in a p-type metal diffusion through the passivating layer and reaction with the base layer, resulting in an ohmic contact.

BRIEF DESCRIPTION OF THE DRAWING

These and other objects of the present invention will be readily understood with reference to the following specification and attached drawing, wherein.

DETAILED DESCRIPTION OF THE INVENTION

Figure 1:
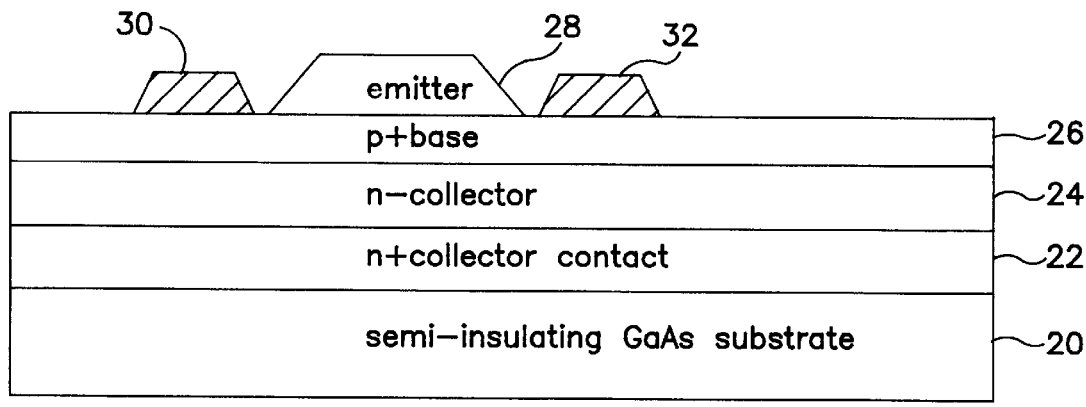
FIG. 1 is an elevational view of a prior art heterojunction bipolar transistor (HBT) illustrating the emitter mesa etched to the emitter-base junction and the formation of base metal contacts on the base epitaxial layer.
Figure 2:
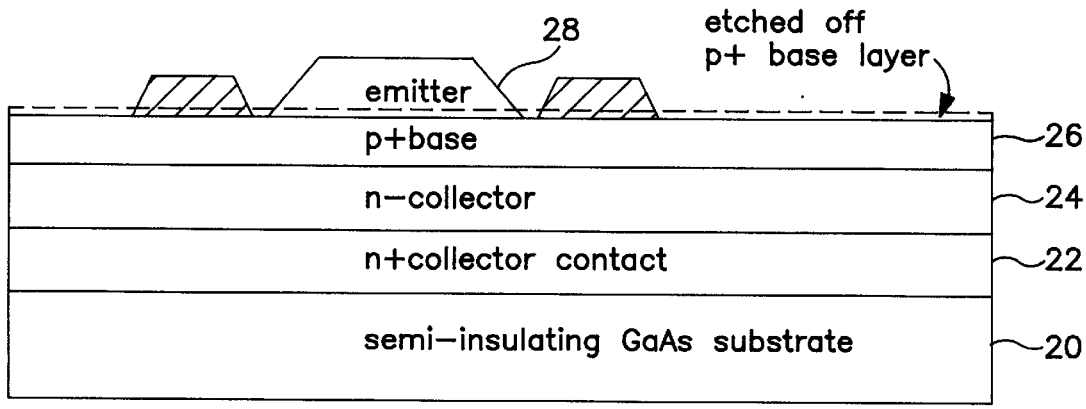
FIG. 2 is similar to FIG. 1 but showing etching of the emitter mesa beyond the emitter junction.
Figure 3:
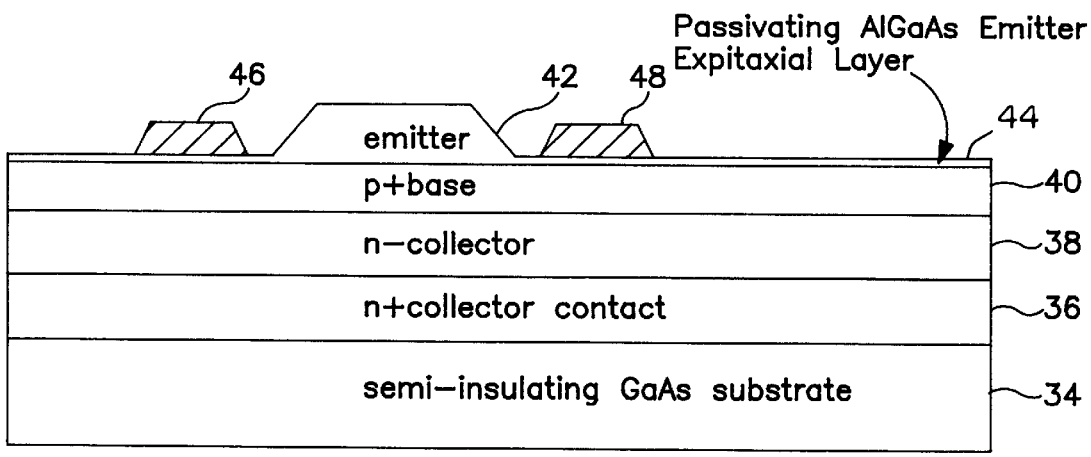
FIG. 3 is an elevational view of an HBT formed in accordance with the present invention, which includes a passivating layer formed on top of the base layer with the base metal contacts formed on top of the passivating layer in accordance with the present invention.

A heterojunction bipolar transistor (HBT), in accordance with the present invention, is shown in one of the next-tofinal stages of processing in FIG. 3. The HBT has a vertically integrated profile with a substrate layer 34, a collector contact layer 36, a collector layer 38, a base layer 40, an emitter mesa 42 and a passivating layer 44 formed by terminating the etching of the emitter mesa 42 to a point just above the emitter-base junction. A pair of base metal contacts 46 and 48 is deposited on top of the passivation layer 44 and spaced from the emitter mesa 42. The passivating layer 44, formed from AlGaAs, results in a relatively wider bandgap, thus minimizing surface recombination velocity at the emitter-base junction, thereby increasing the gain ($\beta$) of the HBT. For example, with such a configuration with a 1400 Å wide base layer at a concentration of $1\times10^{19}$ cm$^{-3}$, the current gains ($\beta$) of >200 can be realized at a current of 1 milliamp in a 3 $\mu$m ×10 $\mu$m emitter HBT. For an 800 Å wide base layer with a concentration of $1\times10^{19}$ cm$^{-3}$, current gains of >400 are possible at a current of 1 milliamp in a 2 $\mu$m×2 $\mu$m emitter HBT.

Figure 4:
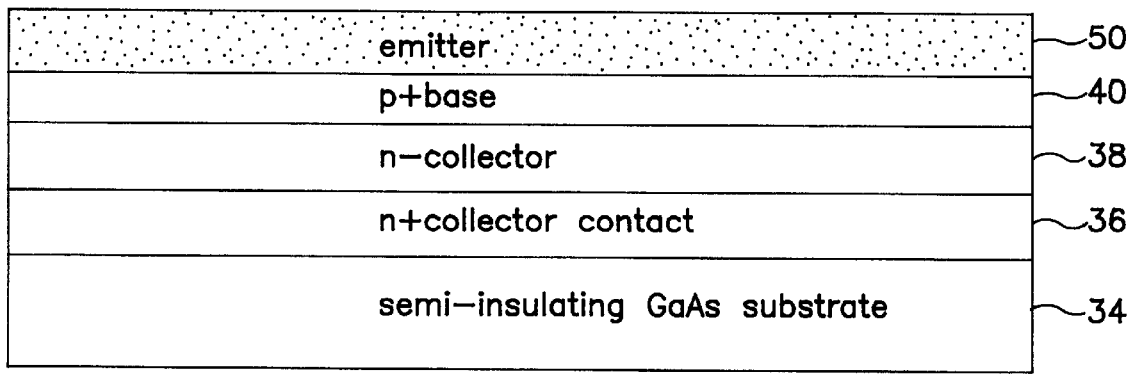
FIG. 4 is an elevational view illustrating the epitaxial wafer growth for the HBT in accordance with the present invention.
Figure 5:
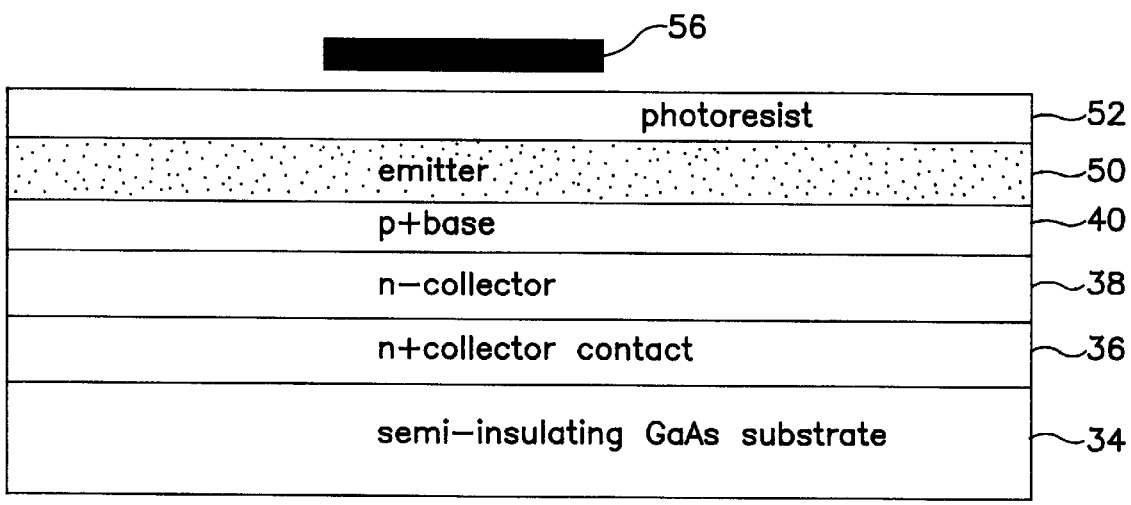
FIG. 5 is similar to FIG. 4 showing the addition of a photoresist and a photomask for emitter mesa definition and base contact access.
Figure 6:
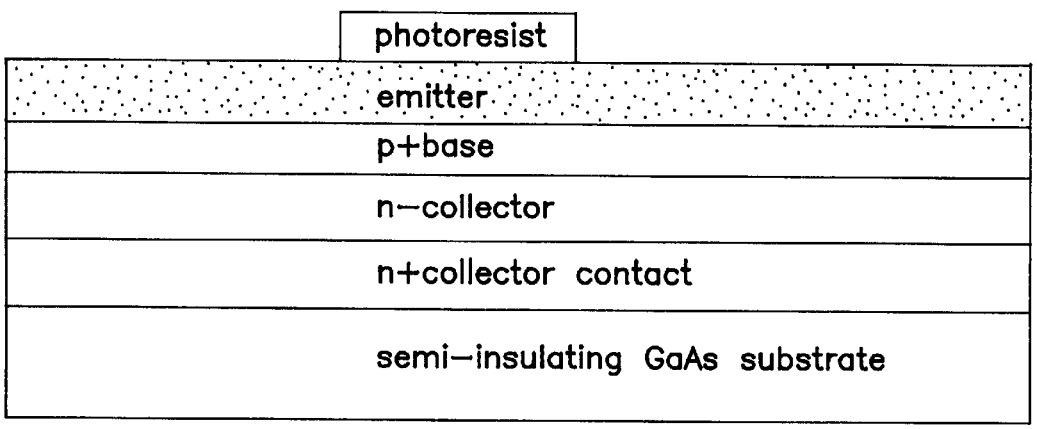
FIG. 6 illustrates the development of the photoresist.
Figure 7:
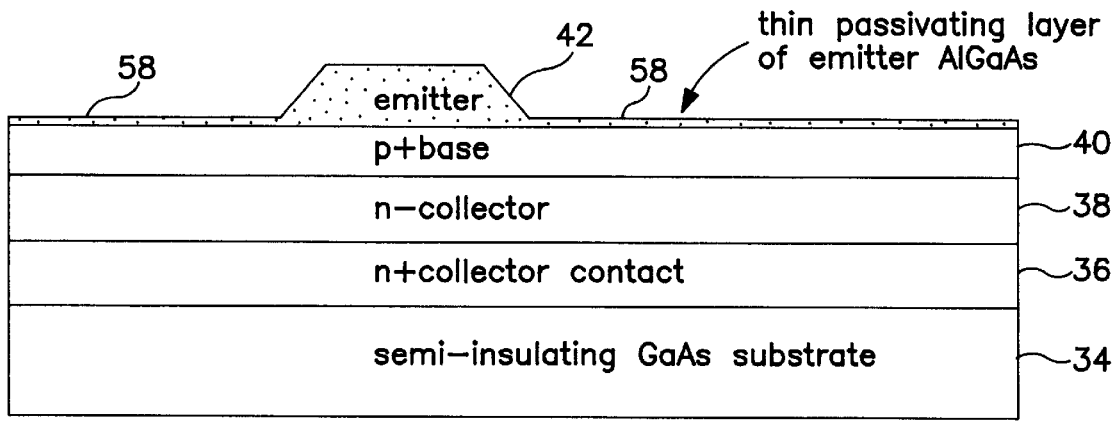
FIG. 7 is similar to FIG. 6, illustrating the formation of the emitter mesa and passivating layer on top of the base epitaxial layer by selective emitter epitaxial etchings terminated prior to the base epitaxial layer.

Initially, as shown in FIG. 4, a substrate material 34, formed from GaAs, is epitaxially grown to a thickness of 25 mils. The collector contact layer 36, the collector layer 38, base layer 40 and emitter layers 50 are epitaxially grown by a suitable process, such as Molecular Beam Epitaxy (MBE) or Metal Organic Chemical Vapor Deposition (MOCVD) to thicknesses of 6000 Å, 7000 Å, 1400 Å and 2650 Å, respectively. After the epitaxial growth, a photoresist layer 52 (FIG. 5) is spun on top of the emitter layer 50. The photoresist 52 is patterned by a photomask 56 to define the emitter mesa and base contact access area. As shown in FIG. 6, the photoresist 52 is exposed through the photomask 56 and developed. All exposed areas of the photoresist are removed, leaving a portion of the photoresist 52 on the emitter epitaxial layer as shown in FIG. 6.

The subcollector layer 36 is formed from an n+ material and the collector layer 38 is formed from an n− material. The base layer 40 is formed from a p+ material. The emitter layer 50 is formed from n-type material, for example, AlGaAs.

After the photoresist is developed in FIG. 6, the emitter mesa 42 is formed by selective wet etching. The selective wet etching is stopped prior to penetration into the base epitaxial layer 40, leaving a thin passivating layer 58 of the emitter AlGaAs, for example, having a thickness of 50 Å, adjacent the emitter mesa 42.

Figure 8:
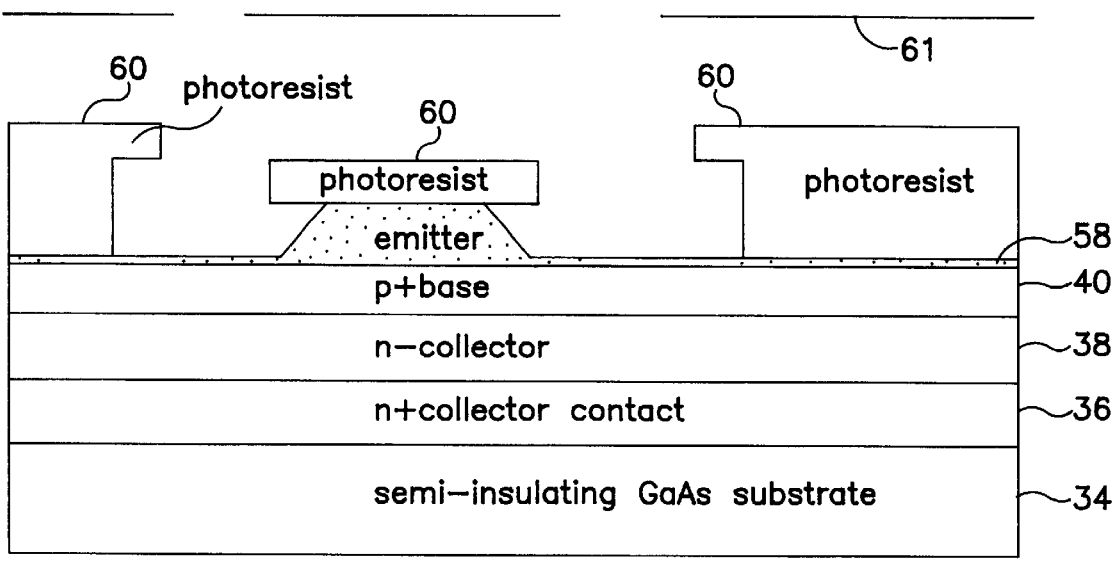
FIG. 8 is similar to FIG. 7, showing the steps of adding a photoresist and exposure of the photoresist for defining the base ohmic contacts.
Figure 9:
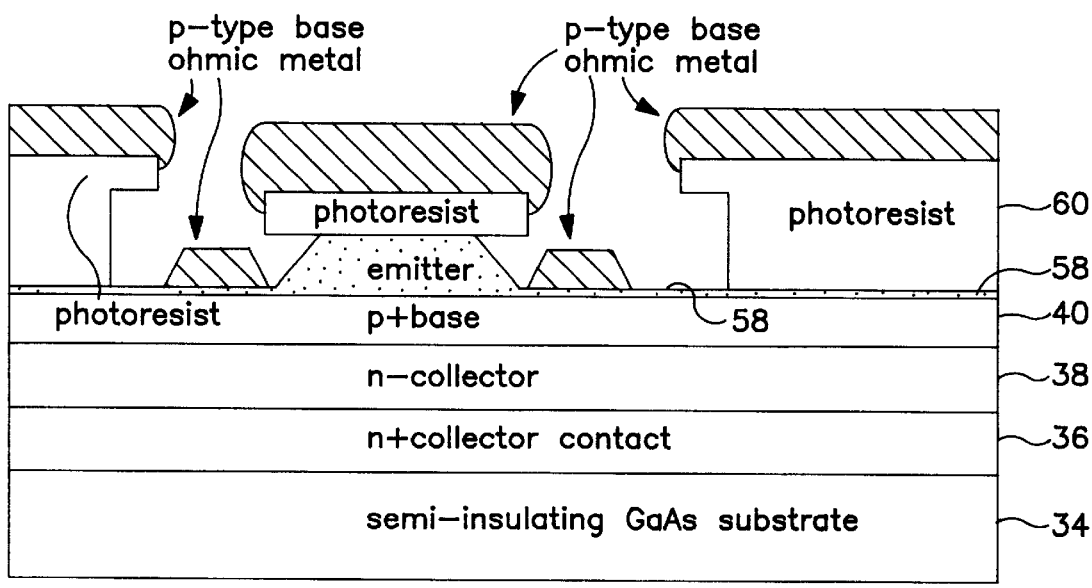
FIG. 9 is similar to FIG. 8, showing the evaporation of the ohmic metal onto the photoresist and the passivating layer.

As shown in FIG. 8, another photoresist 60 is spun on top of and patterned by a photomask 61 to define the base ohmic contact locations. The photoresist layer 60 is exposed through the photomask 61 and developed. Exposed portions of the photoresist 60 are removed as shown in FIG. 8 to define the ohmic base contact locations. Once the base ohmic contact locations are defined, a p-ohmic contact metal is evaporated onto all areas, including the n-type passivating layer 40, including the photoresist 60, as well as the exposed areas of the passivating layer 58. For example, various contact metals, such as AuBe/Pd/Au in thicknesses of, for example, 1000, 100 and 1500 Å, respectively, may be evaporated and thus deposited on the photoresist 60, as well as the passivating layer 58 as shown in FIG. 9.

Figure 10:
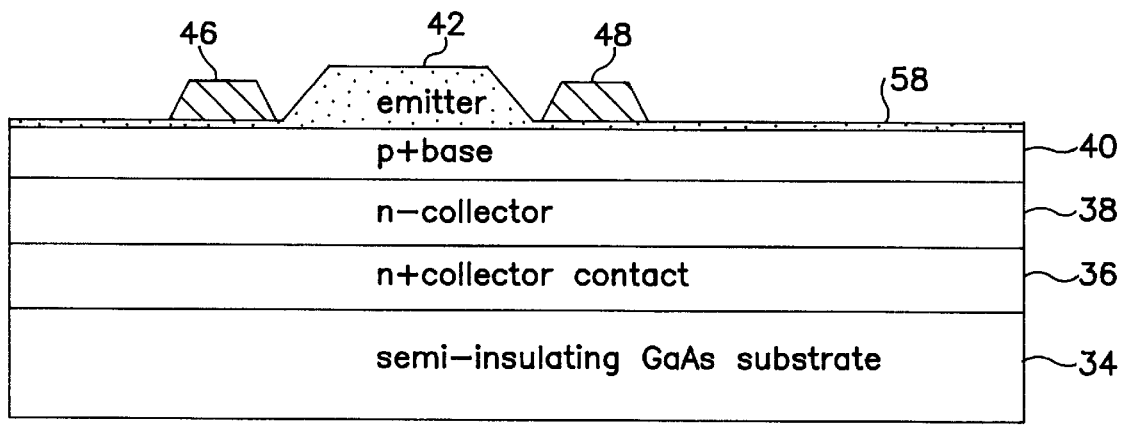
FIG. 10 shows the lift-off of the photoresist and remaining metal adjacent the emitter mesa leaving the base metal contacts.
Figure 11:
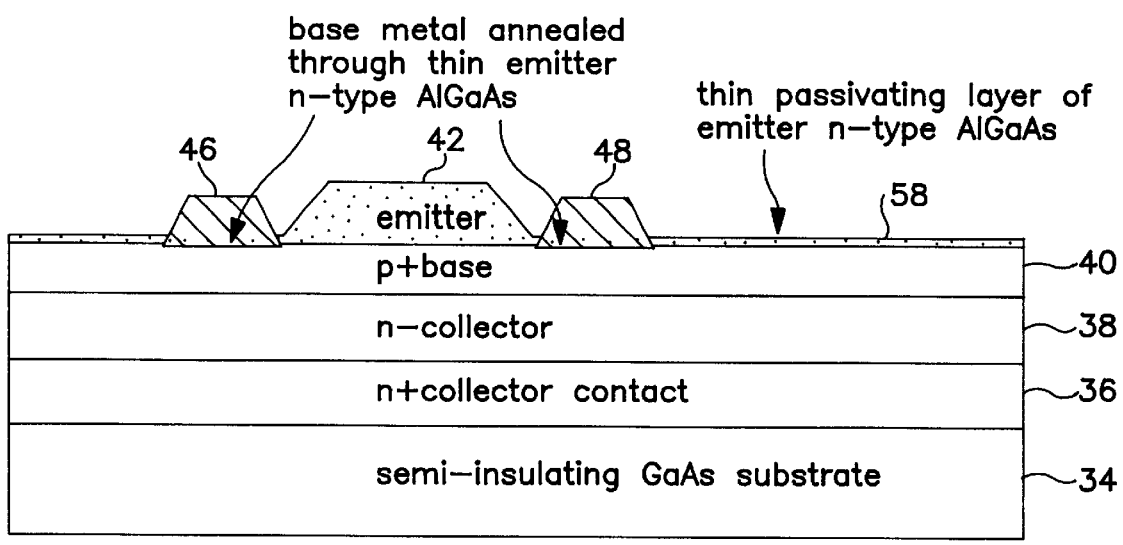
FIG. 11 illustrates the effect of annealing the base metal contacts and the diffusion of the base metal contacts to the base epitaxial layer, forming an ohmic contact.

The photoresist 60 is removed, which, in turn, lifts off the metal deposited on the photoresist 60 but not on the passivating later 58 to form the base metal contacts 46 and 48 as generally shown in FIG. 10. As mentioned above, the passivating layer 58 creates a wider bandgap at the emitter-base junction, thereby minimizing surface recombination velocity at the emitter-base junction, thereby increasing the overall gain ($\beta$) of the HBT. The p-ohmic contacts 46 and 48 are then annealed, resulting in the p-type metal diffusing through the passivating layer 58 to react with the base layer 40, forming base ohmic contacts. The annealing process insures a low-resistance contact between the p-ohmic metal and p+ base. The annealing process for a p-type ohmic material is about 450° C. for about eight minutes in a nitrogen ambient.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A method for fabricating a heterojunction bipolar transistor (HBT) comprising the steps of:
    a) providing a vertically integrated device having a substrate layer, a subcollector layer, a collector layer, a base layer and an emitter layer formed one on top of the other;
    b) forming a first photoresist over the emitter layer;
    c) creating a photomask patterned to define the location of an emitter mesa and access to said base layer;
    d) exposing and developing said photoresist to remove all but a portion of the first photoresist on the emitter layer;
    e) etching said emitter layer to form an emitter mesa and a thin passivating layer, said etching controlled to leave said thin passivating layer of said emitter on top of said base layer in addition to said emitter mesa;
    f) applying a second photoresist to define the location of a pair of base metal contacts;
    g) exposing and developing said second photoresist to expose portions of the passivating layer, as well as creating an overhang on the emitter mesa to define locations for the base metal contacts;
    h) depositing a metal layer on said exposed areas of said passivating layer, as well as on top of said photoresist, forming base metal contacts, that are self aligned with respect to said emitter mesa;
    i) removing said second photoresist, as well as said metal layer on top of said photoresist, leaving a pair of base metal contacts that are self aligned with respect said emitter mesa on said passivating layer; and
    j) annealing said remaining base metal contacts to cause diffusion of said base metal contacts through said passivating layer to enable reaction of said base metal contacts with said base layer resulting in base ohmic contacts.

2. A method as recited in claim 1, wherein said substrate is formed from GaAs.

3. A method as recited in claim 1, wherein said collector contact layer is formed from an n+ material.

4. A method as recited in claim 1, wherein said collector layer is formed from an n− material.

5. A method as recited in claim 1, wherein said base layer is formed from a p+ material.

6. A method as recited in claim 1, wherein said emitter layer is formed from AlGaAs.

7. A method as recited in claim 1, wherein said one or more metals are formed from a p-type ohmic material.

8. A method for fabricating a heterojunction bipolar transistor (HBT) comprising:
    a) forming a structure with a vertically integrated profile having a substrate layer, a collector contact layer, a collector layer, a base layer and an emitter layer;
    b) etching said emitter layer to form an emitter mesa and a thin passivating layer;

c) forming a photoresist to define a base metal contact location on said passivating layer relative to said emitter mesa;

d) depositing a base metal on selected portions of said passivating layer to form base metal contacts which are self aligned relative to said emitter mesa; and e) annealing said base metal contacts to cause diffusion to said base layer.

9. The method as recited in claim 8, wherein said substrate is formed from GaAs.

10. The method as recited in claim 8, wherein said collector contact layer is formed from an n+ material.

11. The method as recited in claim 8, wherein said collector layer is formed from an n− material.

12. The method as recited in claim 8, wherein said base layer is formed from a p+ material.

13. The method as recited in claim 8, wherein said emitter layer is formed from AlGaAs.

14. The method as recited in claim 8, wherein a p-type ohmic material is used as a base metal to form the base ohmic contacts.

* * * * *